US012726688B2

(12) United States Patent
Chou

(10) Patent No.: US 12,726,688 B2
(45) Date of Patent: Sep. 1, 2026

(54) IMAGE SENSING DEVICE AND IMAGE SENSING METHOD FOR REDUCING POWER CONSUMPTION WHILE MAINTAINING ABILITY TO CONDUCT HIGH-RESOLUTION IMAGE SENSING

(71) Applicant: Himax Imaging Limited, Tainan City (TW)

(72) Inventor: Yi-Chen Chou, Tainan City (TW)

(73) Assignee: Himax Imaging Limited, Tainan City (TW)

( * ) Notice: Subject to any disclaimer, the term of this patent is extended or adjusted under 35 U.S.C. 154(b) by 178 days.

(21) Appl. No.: 18/773,552

(22) Filed: Jul. 15, 2024

(65) Prior Publication Data

US 2026/0019684 A1 Jan. 15, 2026

(51) Int. Cl.

*H04N 23/13* (2023.01)
*H04N 25/78* (2023.01)
*H10F 39/00* (2025.01)

(52) U.S. Cl.

CPC ............. *H04N 23/13* (2023.01); *H04N 25/78* (2023.01); *H10F 39/802* (2025.01)

(58) Field of Classification Search

CPC ....... H04N 23/13; H04N 25/78; H10F 39/802
USPC ....................................................... 348/222.1
See application file for complete search history.

(56) References Cited

U.S. PATENT DOCUMENTS

2023/0038159 A1* 2/2023 Holland ................ H04N 23/61
2025/0022414 A1* 1/2025 Cho ..................... G09G 3/3225
2025/0104431 A1* 3/2025 Gravelle ............... G06V 20/52

* cited by examiner

*Primary Examiner* — Joel W Fosselman
(74) *Attorney, Agent, or Firm* — Winston Hsu

(57) ABSTRACT

An image sensing device includes an alert sensor and an image sensor. The alert sensor includes a plurality of alert pixels for sensing light changes corresponding to the plurality of alert pixels. The image sensor includes a pixel array for capturing an image. The alert sensor is initially turned on and the image sensor is initially turned off. When the light changes meet a predetermined condition, the alert sensor turns on the image sensor to capture the image and then the alert sensor is turned off accordingly. The plurality of alert pixels are arranged around a periphery of the pixel array. There is a distance between each alert pixel and the pixel array, and the alert pixels and the pixel array are formed on the same substrate.

18 Claims, 8 Drawing Sheets

IMAGE SENSING DEVICE AND IMAGE SENSING METHOD FOR REDUCING POWER CONSUMPTION WHILE MAINTAINING ABILITY TO CONDUCT HIGH-RESOLUTION IMAGE SENSING

BACKGROUND OF THE INVENTION

1. Field of the Invention

The disclosure is related to an image sensing device and an image sensing method, and more particularly, an image sensing device and an image sensing method for reducing power consumption while maintaining ability to conduct high-resolution image sensing.

2. Description of the Prior Art

In the realm of object detection, the procurement of object imagery serves as a critical mechanism for ascertaining the presence or absence of said object. However, the execution of such operations necessitates the continuous activation of the sensor. To illustrate, consider an array composed of multiple sensors. The sustained enablement of these sensors over extended periods is a prerequisite. While this configuration facilitates effective object detection, it poses a significant drawback in terms of power consumption. With respect to portable devices, such as mobile phones, cameras, and wireless sensors, maintaining a large quantity of sensors in an enabled state for prolonged durations impedes the reduction of power consumption, thereby engendering inconvenience in usage.

SUMMARY OF THE INVENTION

An embodiment provides an image sensing device including an alert sensor and an image sensor. The alert sensor includes a plurality of alert pixels and is used to sense light changes corresponding to the plurality of alert pixels. The image sensor includes a pixel array and is used to capture an image. The alert sensor is initially turned on and the image sensor is initially turned off. When the light changes meet a predetermined condition, the alert sensor turns on the image sensor to capture the image and then the alert sensor is turned off accordingly. The plurality of alert pixels are arranged around a periphery of the pixel array. There is a distance between each alert pixel and the pixel array, and the alert pixels and the pixel array are formed on the same substrate.

Another embodiment provides an image sensing method for an image sensing device. The image sensing device includes an alert sensor and an image sensor. The alert sensor includes a plurality of alert pixels and is used to sense light changes corresponding to the plurality of alert pixels. The image sensor includes a pixel array and is used to capture an image. The image sensing method includes turning on the alert sensor and turning off the image sensor; and when the alert sensor determines that the light changes meet a predetermined condition, turning on the image sensor by the alert sensor, and then turning off the alert sensor accordingly. The plurality of alert pixels are arranged around a periphery of the pixel array. There is a distance between each alert pixel and the pixel array, and the alert pixels and the pixel array are formed on the same substrate.

These and other objectives of the present invention will no doubt become obvious to those of ordinary skill in the art after reading the following detailed description of the preferred embodiment that is illustrated in the various figures and drawings.

DETAILED DESCRIPTION

In the text, when a pixel is turned on, the pixel is activated to operate normally with higher power consumption. When a pixel is turned off, the pixel is deactivated, thereby utilizing the minimal power consumption or no power consumption. In the text, each pixel can be used to detect intensity of light. In the text, "light changes" can refer to the variations in the intensity of light that is sensed.

Figure 1:
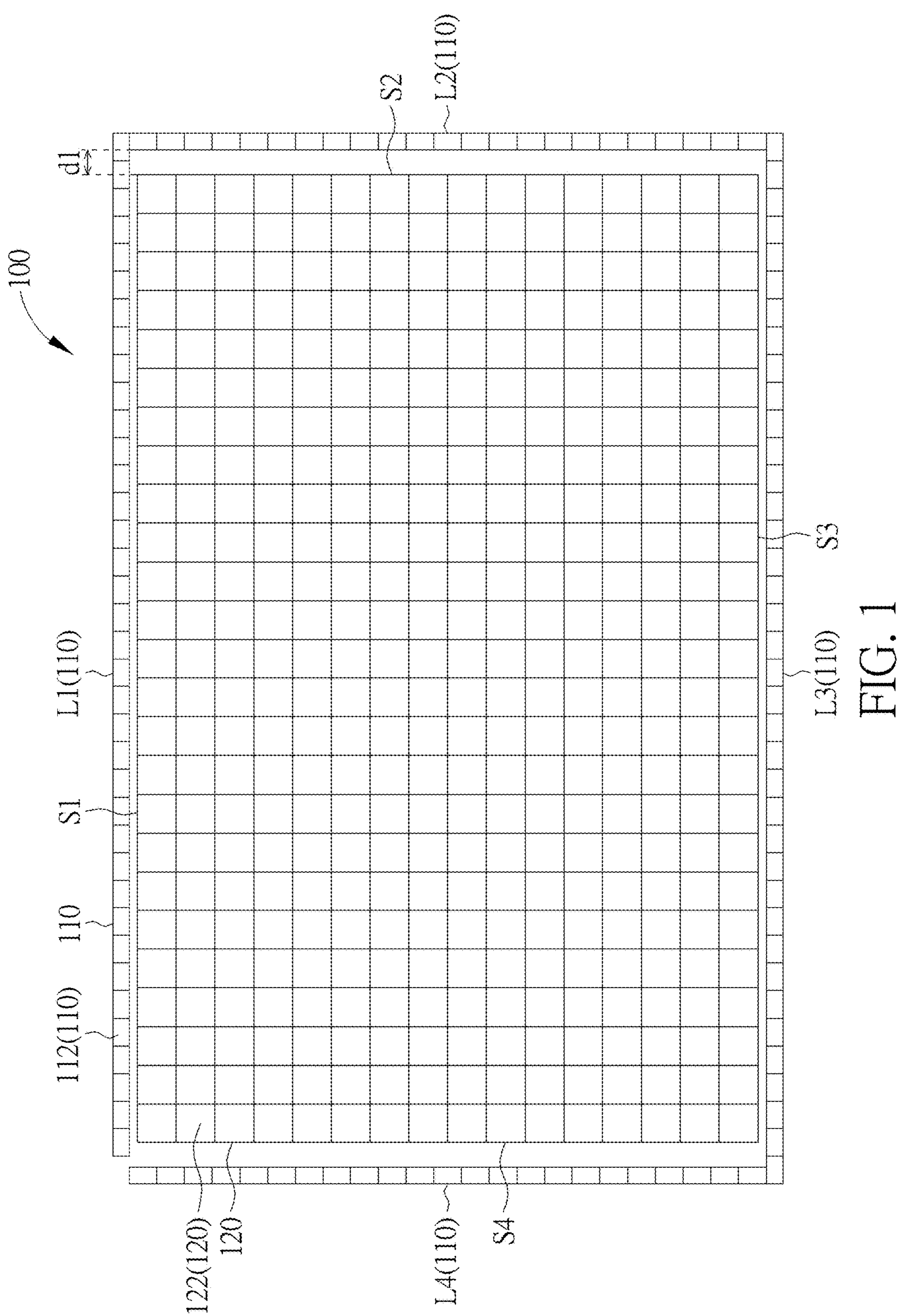
FIG. 1 illustrates an image sensing device according to an embodiment.

FIG. 1 illustrates an image sensing device 100 according to an embodiment. The image sensing device 100 can include an alert sensor 110 and an image sensor 120. The alert sensor 110 can include a plurality of alert pixels 112 for sensing light changes corresponding to the plurality of alert pixels 112. The image sensor 120 can include a pixel array 122 for capturing an image (e.g. image of a detected object).

The alert sensor 110 can be initially turned on, and the image sensor 120 can be initially turned off. When the light changes sensed by the alert sensor 110 meet a predetermined condition, the alert sensor 110 can turn on the image sensor 120 to capture the image and then the alert sensor 110 can be turned off accordingly.

The alert pixels 112 of the alert sensor 110 can be arranged around a periphery of the pixel array 122 of the image sensor 120. There can be a gap with a distance d1 in FIG. 1 between each alert pixel 112 and the pixel array 122, and the alert pixels 112 and the pixel array 122 can be formed on the same substrate.

The alert sensor 110 and the image sensor 120, for instance, can serve as the sensors for an image capture device. As depicted in FIG. 1, the alert pixels 112 can be disposed as a ring. When an image of an object is detected to move into an area enclosed by the ring, the light changes can be detected by the alert sensor 110, thus identifying the object. At this point, the image sensor 120 can be switched from an off state to an on state, enabling the pixel array 122 to detect the object in the subsequent stage. This allows the image sensor 120 to remain off until the object appears, effectively reducing unnecessary power consumption.

Figure 2:
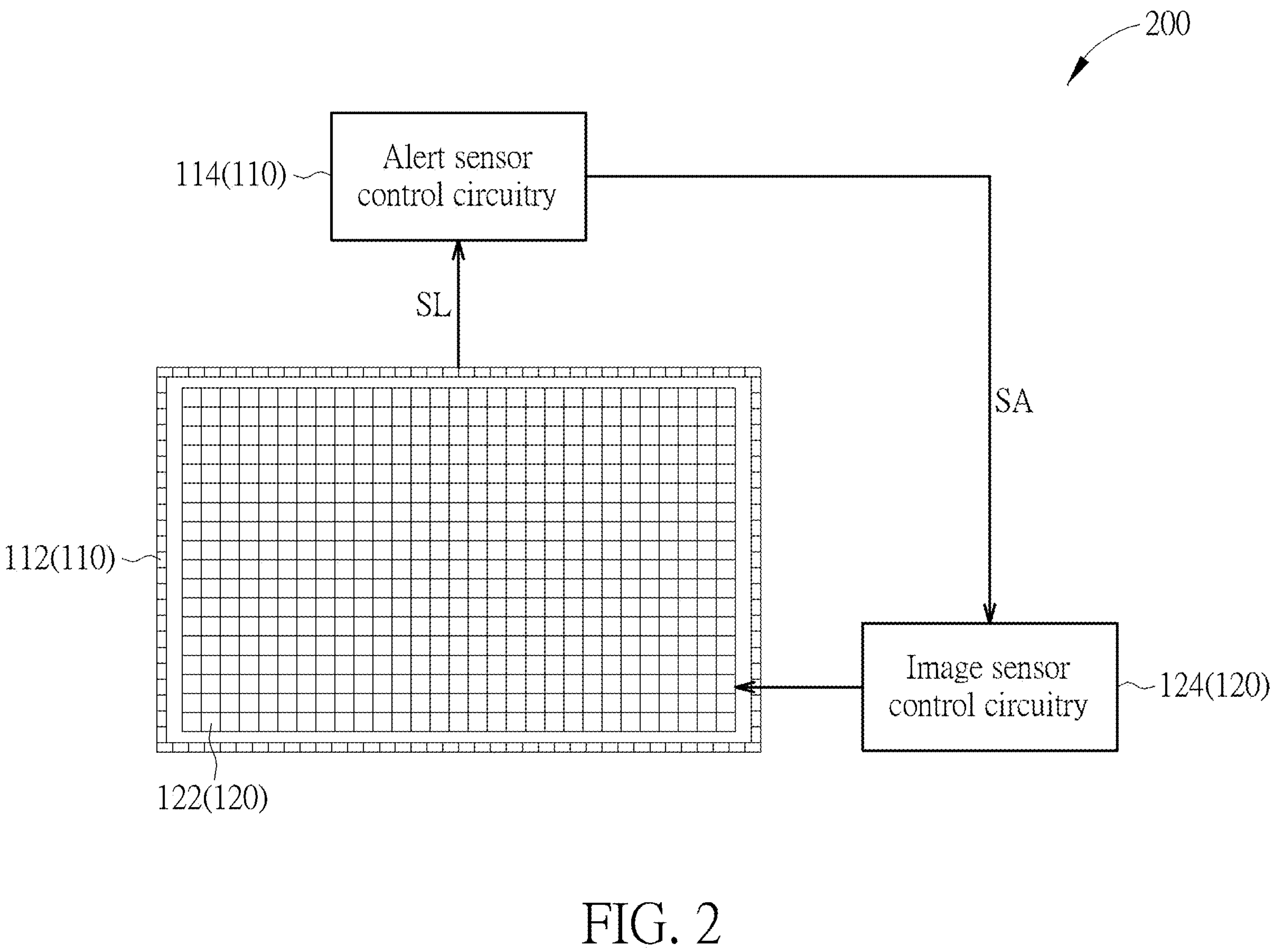
FIG. 2 to FIG. 4, FIG. 6 and FIG. 7 illustrate image sensing devices according to different embodiments.

FIG. 2 illustrates an image sensing device 200 according to another embodiment. In the image sensing device 200, the alert sensor 110 can further include an alert sensor control circuitry 114 coupled to the alert pixels 112 of the alert sensor 110. The image sensor 120 can further include an image sensor control circuitry 124 coupled to the pixel array 122 and the alert sensor control circuitry 114. The image sensor control circuitry 124 can operate the pixel array 122 to capture the image (e.g. image of the object) in response to the light changes sensed by the alert pixels 112.

The alert pixels 112 can transmit light signals SL for detecting the light changes sensed by the alert sensor 110. The alert sensor control circuitry 114 can receive the light signals SL and output an alert signal SA to control the image sensor 120 based on the light signals SL if the light changes meet the predetermined condition in a temporal domain. Each of the light signals SL can be related to bright intensity. The alert pixels 112 can transmit light signals SL to the alert sensor control circuitry 114. The alert sensor control circuitry 114 can transmit the alert signal SA to the image sensor control circuitry 124 when the alert sensor control circuitry 114 determines the light changes meet the predetermined condition according to the light signals SL. The image sensor control circuitry 124 can turn on the pixel array 122 according to the alert signal SA.

After the image sensor 120 is turned on, the image sensor 120 can be further triggered to capture another image by an external trigger signal or an instruction from a post processor.

In FIG. 2, the alert sensor 110 can be turned off after the alert sensor 110 transmits the alert signal SA to control the image sensor 120, and the alert signal SA can be generated by assessing the fluctuations in the light signals SL transmitted from the alert pixels 112 over time.

In FIG. 2, after the image sensor 120 is turned on, the image sensor 120 can be turned off after generating at least one image, and then the alert sensor 110 can be turned on.

The pixel array 122 can include a plurality of image pixels, and each alert pixel 112 can be larger than each image pixel.

In FIG. 1 and FIG. 2, the alert pixels 112 can be configured in a linear formation along the boundary of the pixel array 122. As shown in FIG. 1, the pixel array 122 can have a rectangular shape. The alert pixels 112 can form a first linear portion L1 disposed in parallel to a first edge S1 of the pixel array 122, a second linear portion L2 disposed in parallel to a second edge S2 of the pixel array 122, a third linear portion L3 disposed in parallel to a third edge S3 of the pixel array 122, and a fourth linear portion L4 disposed in parallel to a fourth edge S4 of the pixel array 122.

Optionally, like FIG. 1, a second end of the first linear portion L1 can be connected to a first end of the second linear portion L2, a second end of the second linear portion L2 can be connected to a first end of the third linear portion L3, and a second end of the third linear portion L3 can be connected to a first end of the fourth linear portion L4.

Figure 3:
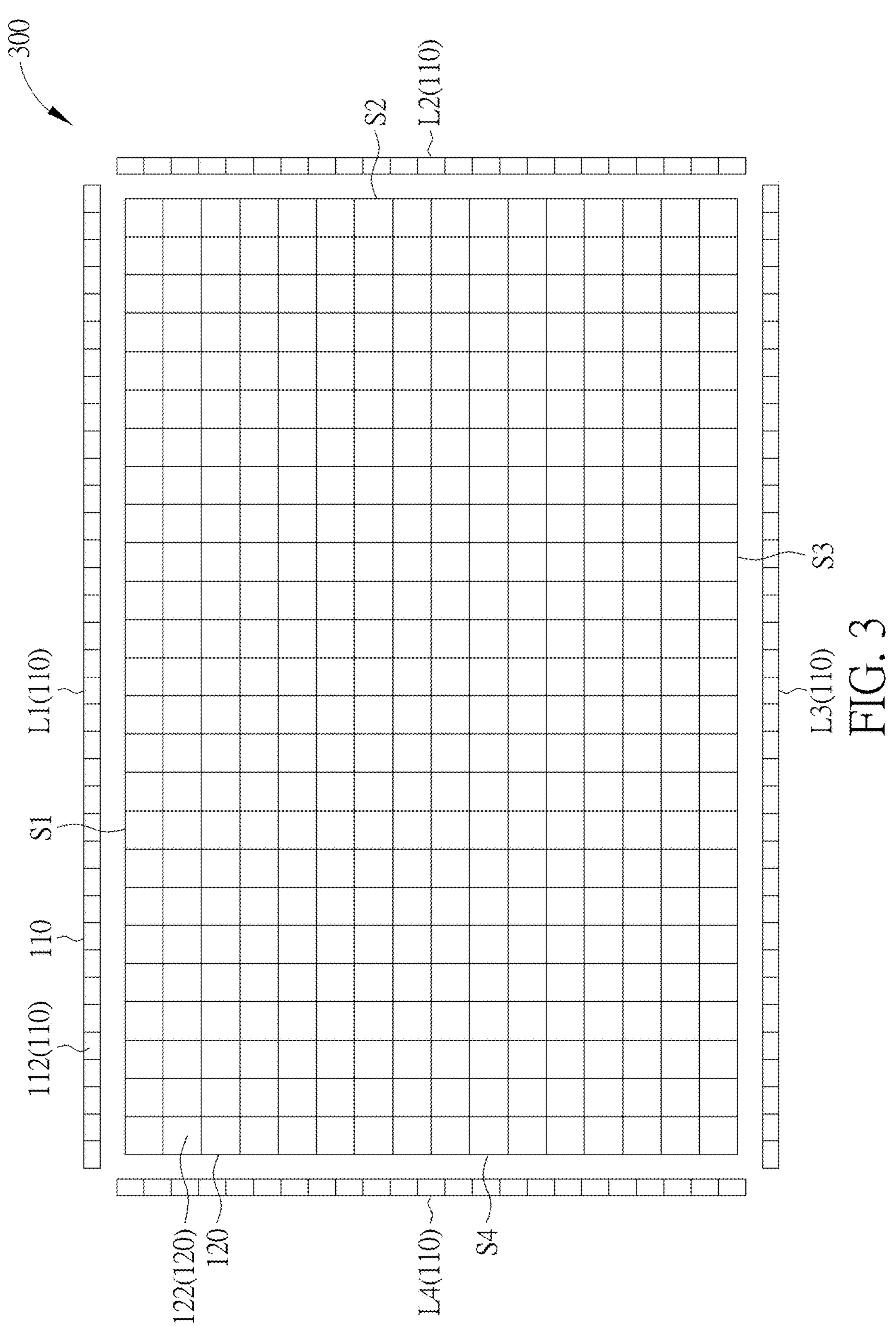

FIG. 1 and FIG. 2 are examples, and the alert pixels 112 can be disposed according to different arrangements. FIG. 3 illustrates an image sensing device 300 according to another embodiment. The image sensing device 300 can be similar to the image sensing device 100, however, in the image sensing device 300, the first linear portion L1, the second linear portion L2, the third linear portion L3 and the fourth linear portion L4 are not connected to one another.

Figure 4:
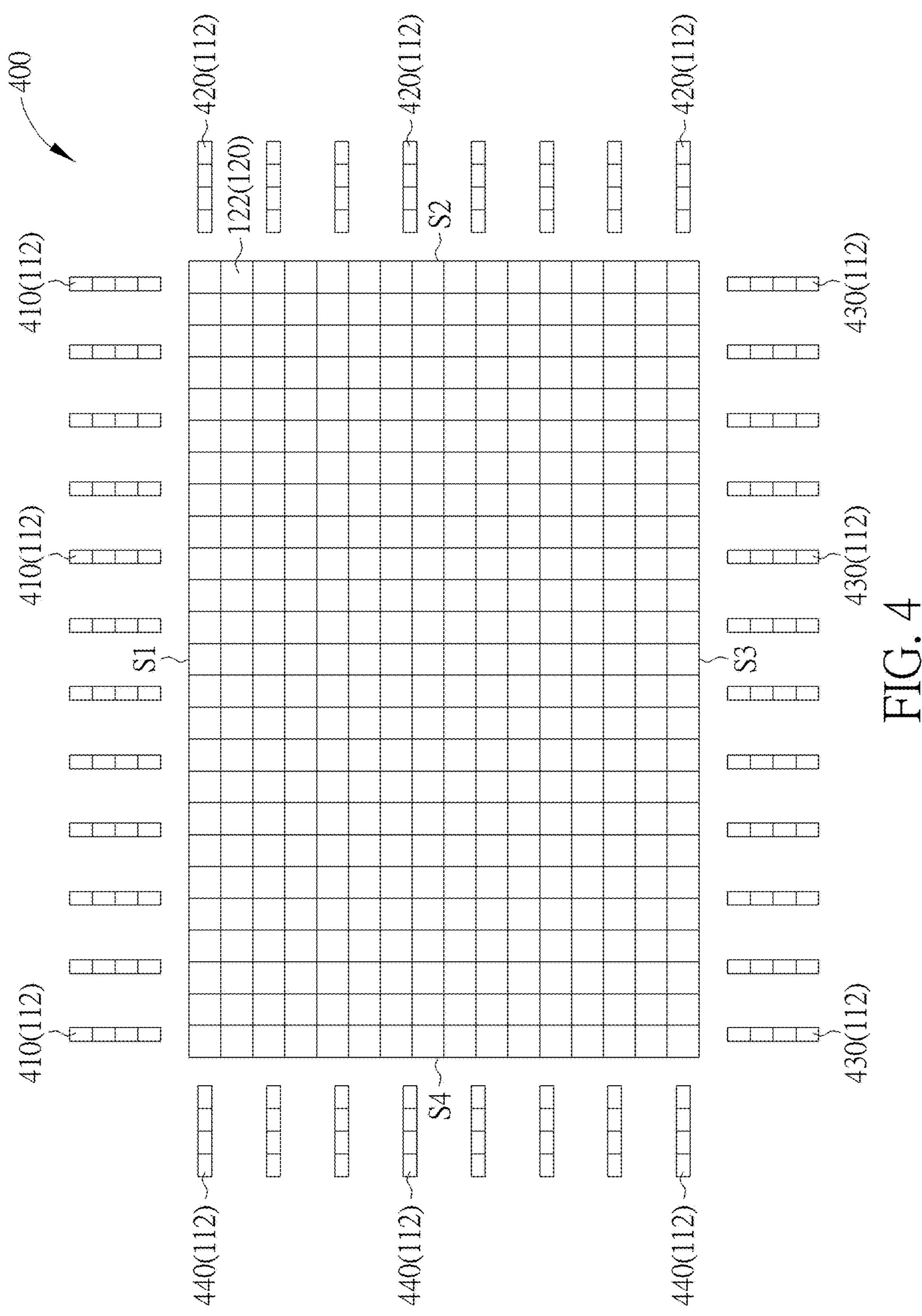

FIG. 4 illustrates an image sensing device 400 according to another embodiment. In FIG. 4, the pixel array 122 can have a rectangular shape. The alert pixels 112 can include a plurality of first linear arrays 410 each disposed in perpendicular to a first edge S1 of the pixel array 122 and beside the first edge S1 of the pixel array 122.

The alert pixels 112 can also include a plurality of second linear arrays 420 each disposed in perpendicular to a second edge S2 of the pixel array and beside the second edge S2 of the pixel array 122.

The alert pixels 112 can also include a plurality of third linear arrays 430 each disposed in perpendicular to a third edge S3 of the pixel array 122 and beside the third edge S3 of the pixel array 122.

The alert pixels 112 can also include a plurality of fourth linear arrays 440 each disposed in perpendicular to a fourth edge S4 of the pixel array 122 and beside the fourth edge S4 of the pixel array 122.

The first linear arrays 410 can be in parallel with one another. The second linear arrays 420 can be in parallel with one another. The third linear arrays 430 can be in parallel with one another. The fourth linear arrays 440 can be in parallel with one another.

Figure 5:
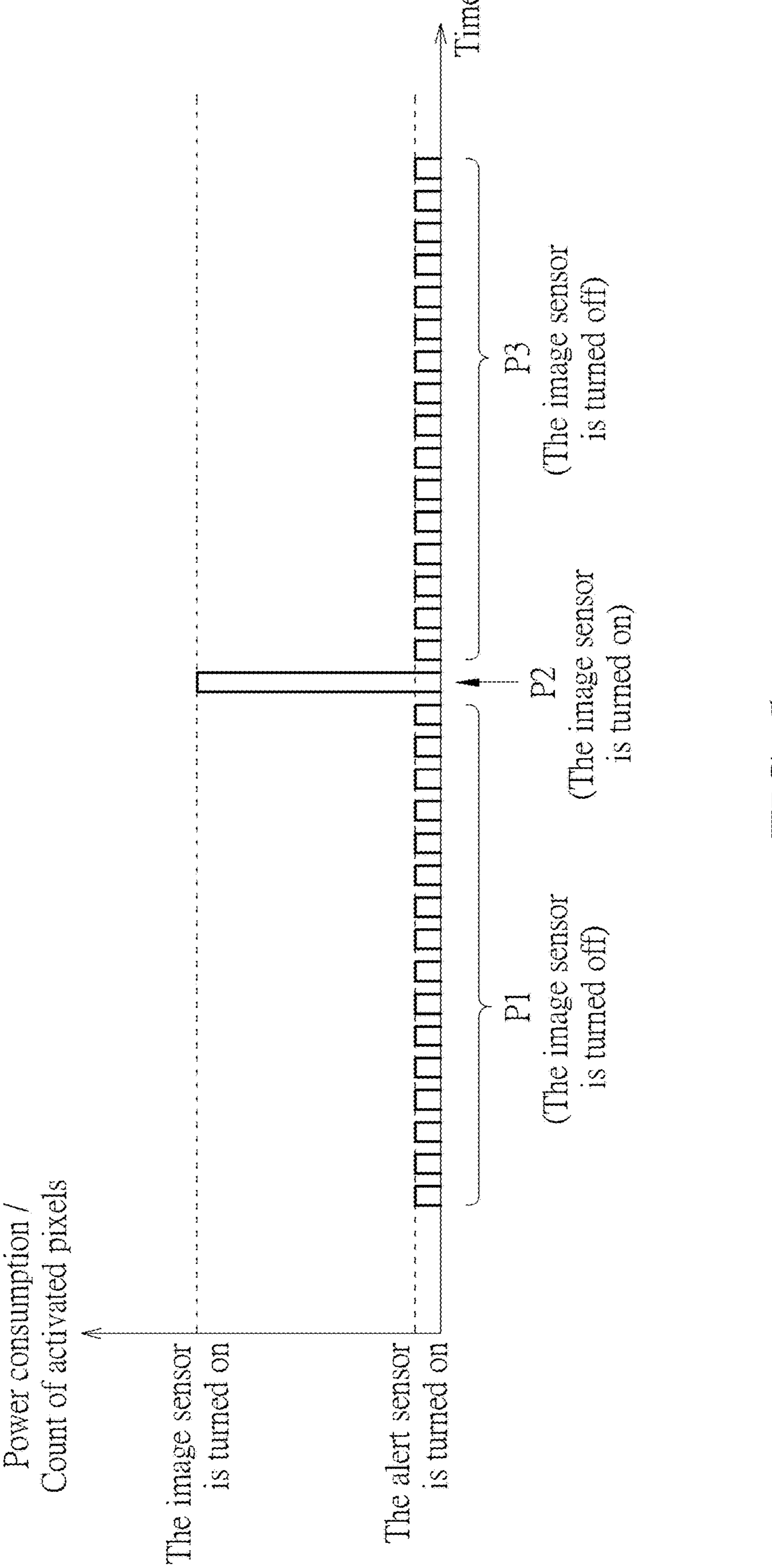
FIG. 5 illustrates a timing diagram for controlling an image sensing device according to an embodiment.

The operations of the image sensing devices 100 to 400 in the temporal domain can be as shown in FIG. 5. FIG. 5 illustrates a timing diagram for controlling an image sensing device according to an embodiment. FIG. 5 can correspond to one of the image sensing devices in FIG. 1 to FIG. 4 and FIG. 6 to FIG. 7. In FIG. 5, the horizontal axis denotes time of the temporal domain, while the vertical axis signifies both power consumption and the count of activated pixels.

In an initial stage P1, the alert sensor 110 can be activated, while the image sensor 120 can be deactivated. Then, the image sensing device can transition to a second stage P2 when the alert pixels 112 detect variations in light that meet a predetermined condition. In the second stage P2, the image sensor 120 can be activated, and the alert sensor 110 can be either activated or deactivated as needed. The stage P2 can correspond to an interruption event, where the appearance or movement of an object is detected. Once the second stage P2 concludes, for instance, when the image of the object is detected to have moved away from the ring area of the alert pixels 112, or when the object has been idle for a period of time, the image sensing device 200 can transition to a third stage P3. The operations in the third stage P3 can be identical to those in the first stage P1, with the alert sensor 110 being activated and the image sensor 120 being deactivated.

The operations depicted in FIG. 5 effectively minimize the number of active pixels during stages P1 and P3, leading to a significant reduction in energy consumption. During stage P2, the pixel array 122 is utilized for high-resolution detection and image capture of the object. This approach not only conserves power but also ensures high-resolution detection.

FIG. 5 is merely an example. After the stage P3, if the alert pixels 112 detect sufficient light variation corresponding to the presence of an object, the operation of stage P2 can be performed again to turn on the pixel array 122.

Figure 6:
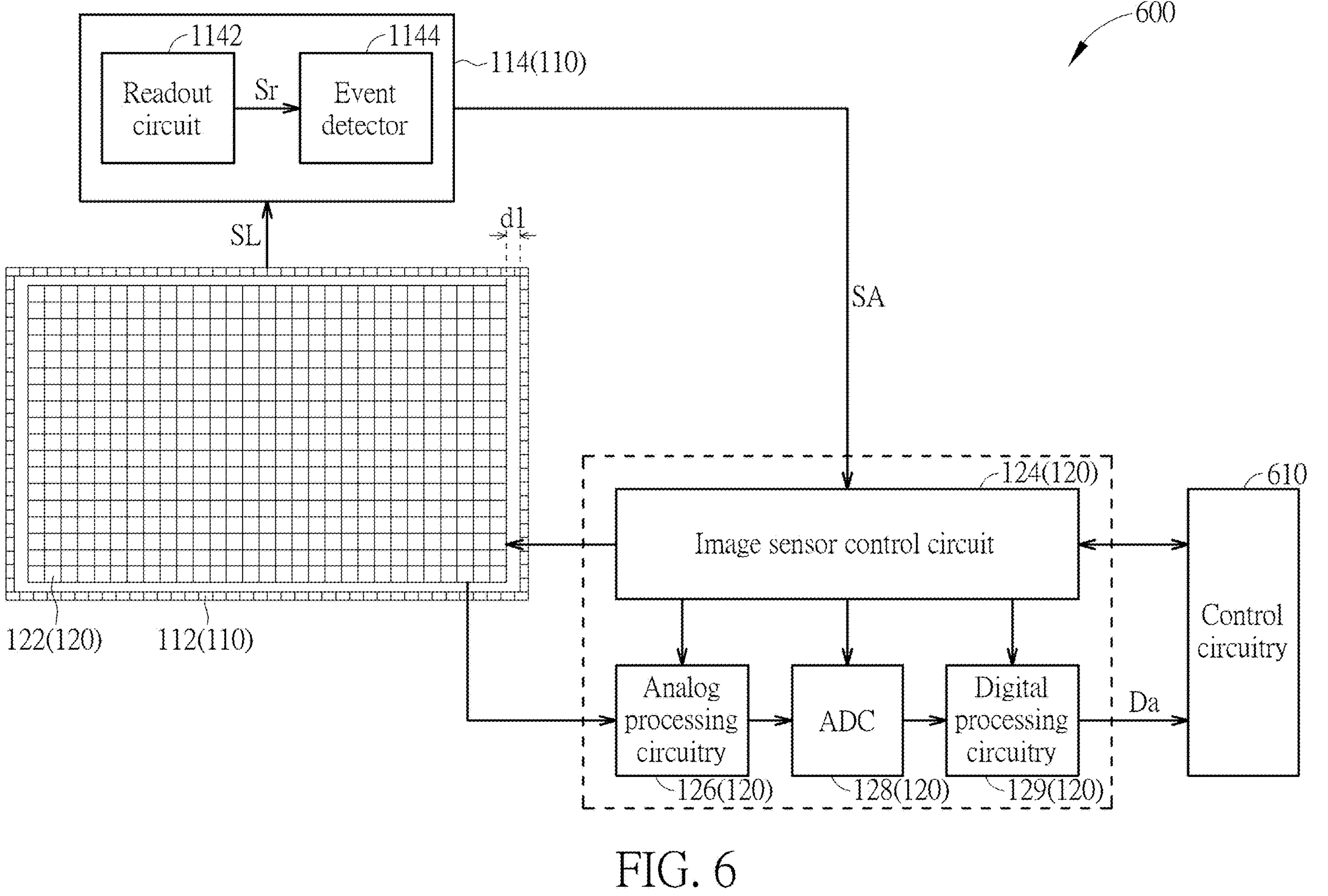

FIG. 6 illustrates an image sensing device 600 according to another embodiment. The image sensing device 600 can be similar to the image sensing device 200 in FIG. 2, but with more details. In FIG. 6, the alert sensor control circuitry 114 can include a readout circuit 1142 and an event detector 1144.

The readout circuit 1142 can be coupled to the alert sensor 110 and generate readout signals Sr when receiving the light signals SL. The event detector 1144 can be coupled to the readout circuit 1142 and generate the alert signal SA when the readout signals Sr are corresponding to a variation reaching a threshold. For example, if the difference between the readout signals Sr at a time T and the readout signals Sr at a previous time (T-1) is greater than the preset value, it can be considered that the variation of the readout signals Sr has reached the threshold.

The readout circuit 1142 can include an analog-to-digital convertor for converting the light signals SL to the readout signals Sr, where the light signals SL can be analog signals, and the readout signals Sr can be digital signals.

In an example, the light signals SL of a given time T and a previous time (T−1) are transmitted to the readout circuit 1142 for analog-to-digital conversion. The event detector 1144 can compare the digital signals of the time T and the previous time (T−1) using subtraction to determine the number of the alert pixels 112 that exhibit sufficient light variation. For instance, a pixel with adequate light variation can be labeled as 1, while a pixel lacking sufficient light variation can be labeled as 0. Subsequently, the event detector 1144 can verify if the number of pixels exhibiting sufficient light variation meets a predetermined threshold. If this threshold is met, the alert signal SA can be transmitted.

In another example, at the time T, the light signals SL can be conveyed to the readout circuit 1142, which performs an analog-to-digital conversion to produce multiple digital signals. The event detector 1144 can then calculate a difference between the average of the digital signals at the time (T−1) and the average of the digital signals at the time T. Following this, the event detector 1144 can verify if this difference meets or exceeds a predetermined value. If so, an alert signal SA can be transmitted.

In another example, at the time T, the light signals SL can be transmitted to the readout circuit 1142, which carries out an analog-to-digital conversion to produce a set of digital signals. The event detector 1144 then calculates the sum of these digital signals of the time T. The event detector 1144 can also compute a difference between the sum of the digital signals of time (T−1) and the sum of the digital signals of the time T. Subsequently, the event detector 1144 can check if this difference meets or exceeds a predetermined value. If the condition is met, an alert signal SA can be transmitted.

In another example, at the time T, the light signals SL can be transmitted to the readout circuit 1142, which conducts an analog-to-digital conversion to produce a set of digital signals. The event detector 1144 can generate a parameter using these digital signals of the time T with a predetermined formula. Similarly, the event detector 1144 can generate another parameter using the digital signals of the previous time (T−1) with the predetermined formula. The event detector 1144 can use these parameters of the times T and (T−1) to perform a specific calculation (for example, a function) to obtain a result value. Based on this result value, the event detector 1144 can determine whether to transmit the alert signal SA.

As shown in FIG. 6, the image sensor 120 can further include an analog processing circuitry 126, an analog-to-digital convertor 128, and a digital processing circuitry 129. The analog processing circuitry 126 can filter and amplify the analog signals from the pixel array 122 to create amplified signals, which are converted to digital signals by the analog-to-digital convertor 128. The digital signals from the analog-to-digital convertor 128 can be processed by the digital processing circuitry 129 to create image data Da. The image data Da can be passed to a control circuitry 610 for analysis and storage.

Figure 7:
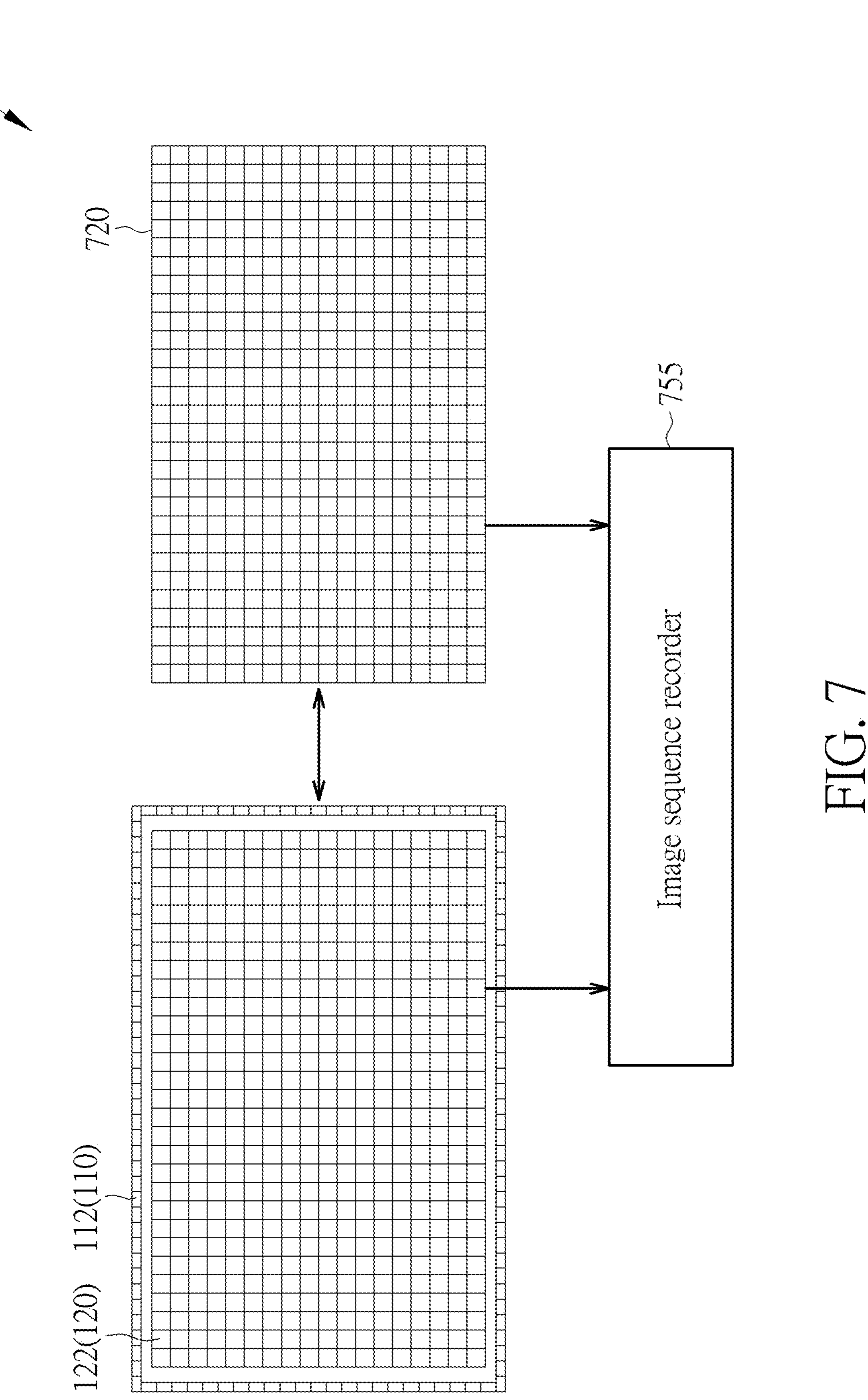

FIG. 7 illustrates an image sensing device 700 according to another embodiment. The image sensing device 700 can be similar to the image sensing device 100 of FIG. 1, and the image sensing device 700 can further include an image sensor 720. When the alert sensor 110 senses the light changes, the alert sensor 110 can trigger the image sensor 720 to turn on the image sensor 720 in addition to the image sensor 120. The image sensor 720 can only include a pixel array, or the image sensor 720 can be part of a hybrid structure. Here, the hybrid structure can have alert pixels and a pixel array located inside an area surrounded by the alert pixels, similar to the structure of FIG. 1. In FIG. 7, the image data generated by the image sensors 120 and 720 can be transmitted to an image sequence recorder 755 to be stored for storage and further processing.

Figure 8:
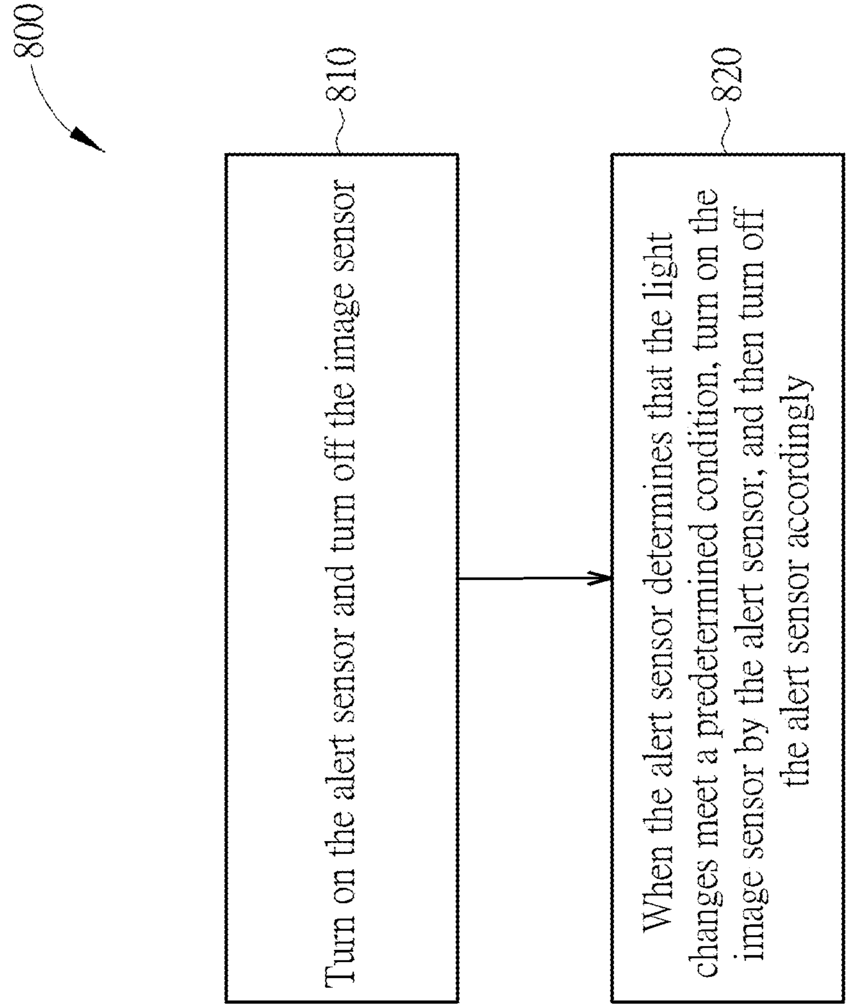
FIG. 8 is a flowchart of an image sensing method according to an embodiment.

FIG. 8 is a flowchart of an image sensing method 800 according to an embodiment. The image sensing method 800 can be performed for the image sensing devices 100, 200, 300, 400, 600 and 700. The image sensing method 800 can include following steps.

Step 810: turn on the alert sensor 110 and turn off the image sensor 120; and

Step 820: when the alert sensor 110 determines that the light changes meet a predetermined condition, turn on the image sensor 120 by the alert sensor 110, and then turn off the alert sensor 110 accordingly.

Step 810 can correspond to the stage P1 of FIG. 5, and Step 820 can correspond to the stage P2 of FIG. 5. In Step 820, the light changes meeting the predetermined condition can correspond to an object. For example, the object may be identified as moving from the exterior to the interior of the ring of the alert pixels 112 in FIG. 1, or vice versa, the object may be identified as moving from the interior to the exterior of the ring of the alert pixels 112 in FIG. 1.

After Step 820, the image sensor 120 can be turned off after the detected object corresponding to the light changes is idle for a predetermined period of time. After Step 820, the image sensor 120 can be turned off after the image sensor 120 no longer detects a detected object corresponding to the light changes.

In conclusion, the use of the image sensing devices 100, 200, 300, 400, 600, and 700, in conjunction with the image sensing method 800, allows for a significant reduction in power consumption while maintaining the ability to conduct high-resolution image detection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensing device, comprising:

an alert sensor comprising a plurality of alert pixels and configured to sense light changes corresponding to the plurality of alert pixels; and a first image sensor comprising a pixel array and configured to capture an image;

wherein the alert sensor is initially turned on and the first image sensor is initially turned off, when the light changes meet a predetermined condition, the alert sensor turns on the first image sensor to capture the image and then the alert sensor is turned off accordingly;

wherein the plurality of alert pixels are arranged around a periphery of the pixel array;

there is a distance between each alert pixel and the pixel array; and the alert pixels and the pixel array are formed on a same substrate;

wherein:

the plurality of alert pixels transmit light signals;

the alert sensor further comprises an alert sensor control circuitry configured to receive the light signals and output an alert signal to control the first image sensor based on the light signals if the light changes meet the predetermined condition in a temporal domain.

2. The image sensing device of claim 1, wherein the first image sensor further comprises:

an image sensor control circuitry configured to operate the pixel array to capture the image in response to the light changes.

3. The image sensing device of claim 1, wherein the first image sensor is further configured to be triggered to capture another image by an external trigger signal or an instruction from a post processor.

4. The image sensing device of claim 1, wherein the plurality of alert pixels are arranged as a pixel line around the periphery of the pixel array.

5. The image sensing device of claim 1, wherein the pixel array comprises a plurality of image pixels, and each alert pixel is larger than each image pixel in size.

6. The image sensing device of claim 1, wherein the pixel array has a rectangular shape, and the alert pixels form a first linear portion disposed in parallel to a first edge of the pixel array, a second linear portion disposed in parallel to a second edge of the pixel array, a third linear portion disposed in parallel to a third edge of the pixel array, and a fourth linear portion disposed in parallel to a fourth edge of the pixel array.

7. The image sensing device of claim 6, wherein a second end of the first linear portion is connected to a first end of the second linear portion, a second end of the second linear portion is connected to a first end of the third linear portion, and a second end of the third linear portion is connected to a first end of the fourth linear portion.

8. The image sensing device of claim 1, wherein:

the pixel array has a rectangular shape;

the alert pixels comprise a plurality of first linear arrays each disposed in perpendicular to a first edge of the pixel array and beside the first edge of the pixel array;

a plurality of second linear arrays each disposed in perpendicular to a second edge of the pixel array and beside the second edge of the pixel array;

a plurality of third linear arrays each disposed in perpendicular to a third edge of the pixel array and beside the third edge of the pixel array; and a plurality of fourth linear arrays each disposed in perpendicular to a fourth edge of the pixel array and beside the fourth edge of the pixel array;

the plurality of first linear arrays being in parallel with one another;

the plurality of second linear arrays being in parallel with one another;

the plurality of third linear arrays being in parallel with one another; and the plurality of fourth linear arrays being in parallel with one another.

9. The image sensing device of claim 1, wherein the alert sensor is turned off after the alert sensor transmits the alert signal to control the first image sensor, and the alert signal is generated based on changes of the light signals transmitted from the plurality of alert pixels in the temporal domain.

10. The image sensing device of claim 1, wherein the first image sensor is turned off after generating at least one image, and then the alert sensor is turned on.

11. The image sensing device of claim 1, wherein:

the alert sensor control circuitry is coupled to the plurality of alert pixels;

the first image sensor further comprises an image sensor control circuitry coupled to the pixel array and the alert sensor control circuitry;

the plurality of alert pixels transmit the light signals to the alert sensor control circuitry;

the alert sensor control circuitry transmits the alert signal to the image sensor control circuitry when the alert sensor control circuitry determines the light changes meet the predetermined condition according to the light signals;

the image sensor control circuitry turns on the pixel array according to the alert signal.

12. The image sensing device of claim 11, wherein the alert sensor control circuitry comprises:

a readout circuit coupled to the alert sensor, and configured to generate readout signals when receiving the light signals;

an event detector coupled to the readout circuit, and configured to generate the alert signal when the readout signals are corresponding to a variation reaching a threshold.

13. The image sensing device of claim 12, wherein the readout circuit comprises an analog-to-digital convertor.

14. The image sensing device of claim 1, further comprising a second image sensor, wherein when the alert sensor senses the light changes, the alert sensor turns on the second image sensor in addition to the first image sensor.

15. An image sensing method for an image sensing device, the image sensing device comprising an alert sensor and a first image sensor, the alert sensor comprising a plurality of alert pixels and being configured to sense light changes corresponding to the plurality of alert pixels, the first image sensor comprising a pixel array and being configured to capture an image, the image sensing method comprising:

turning on the alert sensor and turning off the first image sensor; and when the alert sensor determines that the light changes meet a predetermined condition, turning on the first image sensor by the alert sensor, and then turning off the alert sensor accordingly;

wherein the plurality of alert pixels are arranged around a periphery of the pixel array;

there is a distance between each alert pixel and the pixel array; and the alert pixels and the pixel array are formed on a same substrate;

wherein:

the plurality of alert pixels transmit light signals;

each of the light signals is related to bright intensity;

the alert sensor further comprises an alert sensor control circuitry configured to receive the light signals and output an alert signal based on the light signals if the light changes meet the predetermined condition in a temporal domain; and the alert signal is generated based on changes of the light signals in the temporal domain.

16. The image sensing method of claim 15, wherein:

the image sensing device further comprises a second image sensor; and when the alert sensor senses the light changes, the alert sensor turns on the second image sensor in addition to the first image sensor.

17. The image sensing method of claim 15, further comprising:

turning off the first image sensor after a detected object corresponding to the light changes is idle for a predetermined period of time.

18. The image sensing method of claim 15, further comprising:

turning off the first image sensor after the first image sensor no longer detects a detected object corresponding to the light changes.

* * * * *